United States Patent [19]
Kominami et al.

[11] 4,236,252
[45] Nov. 25, 1980

[54] DOUBLE-CONVERTING FM TUNER

[75] Inventors: Yasuo Kominami, Kokubunji; Masanori Ienaka; Takeshi Wada, both of Kodaira; Yukihiko Miyamoto; Tsuneo Yamada, both of Tokyo, all of Japan

[73] Assignee: Hitachi, Ltd., Japan

[21] Appl. No.: 10,019

[22] Filed: Feb. 6, 1979

[30] Foreign Application Priority Data

Mar. 15, 1978 [JP] Japan .................. 53/28657

[51] Int. Cl.³ .............................. H04B 1/26
[52] U.S. Cl. .................... 455/207; 455/315
[58] Field of Search ............... 329/110, 116, 128, 126; 455/205, 207, 214, 314, 315, 337; 325/318, 444, 345, 349, 430–432, 479, 487, 445

[56] References Cited

U.S. PATENT DOCUMENTS

| | | | |
|---|---|---|---|
| 3,473,133 | 10/1969 | Hummel | 329/126 |
| 3,641,441 | 2/1972 | Gunn et al. | 325/430 |
| 3,665,507 | 5/1972 | Peil | 325/432 |
| 3,673,499 | 6/1972 | Avins et al. | 325/344 |
| 3,939,429 | 2/1976 | Löhn et al. | 325/432 |
| 4,091,330 | 5/1978 | Hidaka | 329/126 |
| 4,122,394 | 10/1978 | Fukushima et al. | 325/344 |

FOREIGN PATENT DOCUMENTS 2140680  4/1976  Fed. Rep. of Germany ........... 455/315

OTHER PUBLICATIONS

"Denpa Kagaku", (Electric Wave Science), Jan. 1977, vol. 532, pp. 161–165.

*Primary Examiner*—Jin F. Ng
*Attorney, Agent, or Firm*—Craig and Antonelli

[57] ABSTRACT

A first intermediate frequency amplifier stage which executes the amplitude limiting operation of a double-converting FM tuner employing the integrated circuit technology is constructed in the form of an integrated circuit. An output signal of the first intermediate frequency amplifier stage is put into a square pulse waveform on the basis of the amplitude limiting operation, and therefore has higher harmonic components of high frequencies. When the higher harmonic components are injected into a second mixer circuit in a second frequency converter circuit, various higher harmonic components which have frequencies higher than a second intermediate frequency appear at the output of the second mixer conduit. When the higher harmonic components at the output of the second mixer circuit are injected into an FM demodulator circuit, beat trouble is induced. The second frequency converter circuit is also constructed in the form of an integrated circuit, and filter means to pass the fundamental waves of a first intermediate frequency signal and to reject the higher harmonic frequency components thereof is connected between the output of the first intermediate frequency amlifier stage executing the amplitude limiting operation and the input of the second mixer circuit, whereby the beat trouble can be prevented.

8 Claims, 1 Drawing Figure

DOUBLE-CONVERTING FM TUNER

BACKGROUND OF THE INVENTION

This invention relates to a double-converting FM tuner.

Heretofore, a double-converting FM tuner has been constructed of an antenna, a radio frequency amplifier stage, a first frequency converter circuit composed of a first mixer circuit and a first local oscillator circuit, a first intermediate frequency filter, a first intermediate frequency amplifier stage, a second frequency converter circuit composed of a second mixer circuit and a second local oscillator circuit, a second intermediate frequency filter, and a demodulator circuit.

As in the case of the superheterodyne system, the double-converting system is prone to cause beat troubles. This is particularly true where an output signal of the first intermediate frequency amplifier stage is limit-amplified which results in the square pulse output current thereof containing large quantities of higher harmonic components. This leads to the disadvantage that the l-th order higher harmonics of the output current of the first intermediate frequency amplifier stage and the m-th order higher harmonics in the output current of the second local oscillator circuit or the n-th order higher harmonics of the second intermediate frequency give rise to cross modulation in the demodulator circuit. These difficulties appear at the output of the demodulator circuit. (Letters l, m and n denote positive integers.)

Usually, the second intermediate frequency filter operates normally at frequencies up to several tens of MHz. For frequencies from several tens of MHz to several hundred MHz, however, a sufficient decay is not attained in the rejection region of the filter on account of the characteristics of circuit components, etc. Accordingly, to inject the output current of the first intermediate frequency amplifier stage containing the large quantities of higher harmonic components directly into the second mixer circuit results in more higher harmonic components than are generated in the second frequency converter circuit when a first intermediate frequency signal not containing such higher harmonic components is supplied. The higher harmonic components increase the quantity of spurious waves to be mixed into the demodulator circuit so that the beat trouble is prone to occur. It has been revealed by the inventor that this phenomenon becomes especially conspicuous when the frequency converter circuits and the demodulator circuit are assembled within an identical semiconductor integrated circuit.

SUMMARY OF THE INVENTION

This invention has for its object to provide a double-converting FM tuner utilizing the semiconductor integrated circuit technology in which higher harmonic components existant in the square pulse waveform output of a first intermediate frequency amplifier stage executing a limit-amplifying operation are prevented from being mixed into a demodulator. The resultant tuner is free from beat troubles.

DESCRIPTION OF THE PREFERRED EMBODIMENT

Figure 1:
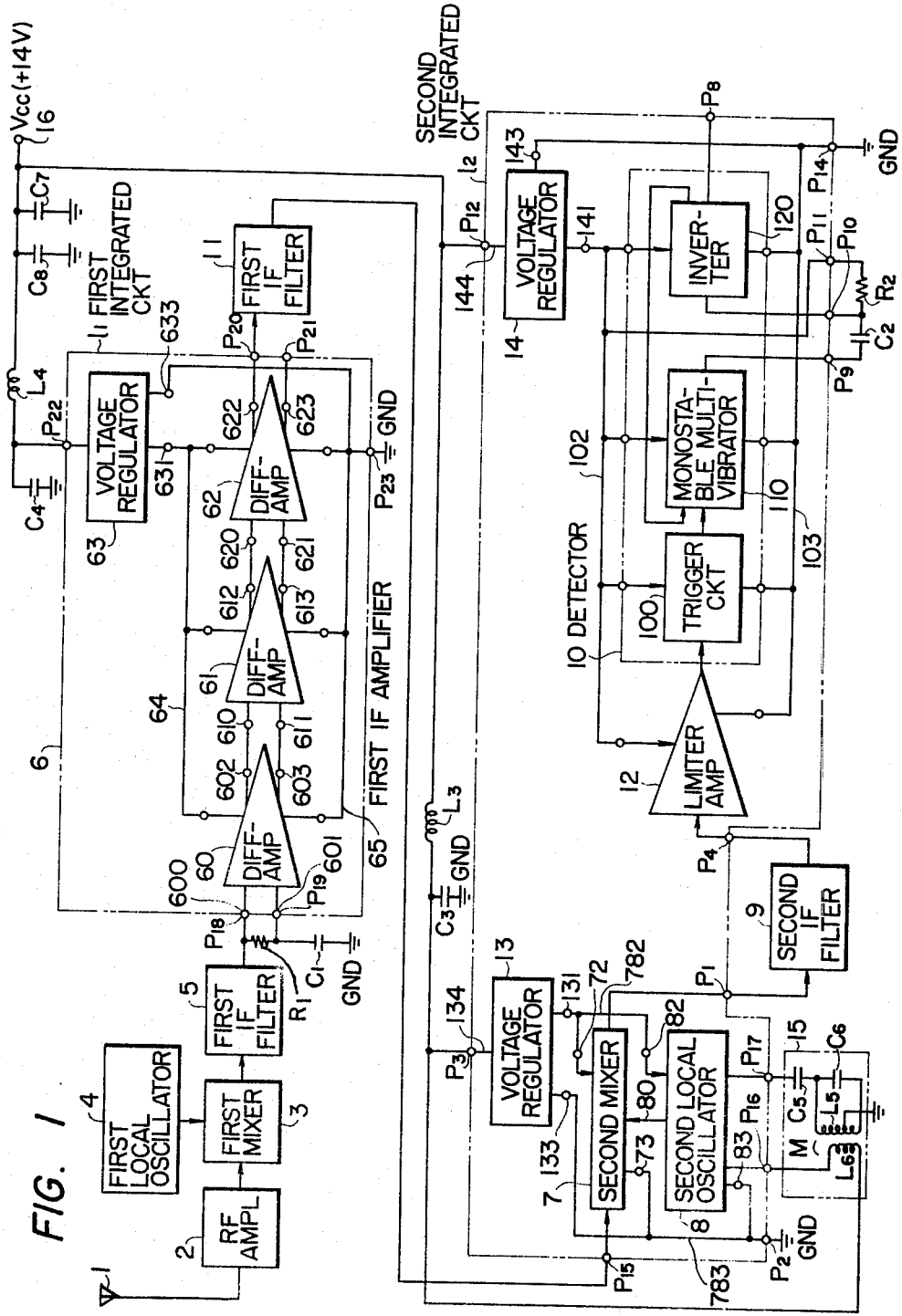
FIG. 1 shows circuit blocks of a double-converting FM tuner embodying this invention.

Hereunder, a preferred embodiment of this invention will be described.

Referring to FIG. 1, numeral 1 designates an antenna, numeral 2 an RF (radio frequency) amplifier stage, numeral 3 a first mixer circuit, numeral 4 a first local oscillator circuit, numeral 5 a first IF (intermediate frequency) filter, numeral 6 a first IF amplifier stage, numeral 7 a second mixer circuit, numeral 8 a second local oscillator circuit, numeral 9 a second IF filter, numeral 10 a detector circuit, and numeral 11 an additional first IF filter which resonates with a first intermediate frequency. A first frequency converter circuit is constructed of the first mixer circuit 3 and the first local oscillator circuit 4, while a second frequency converter circuit is constructed of the second mixer circuit 7 and the second local oscillator circuit 8. Shown at 12 is a limiting amplifier circuit which limit-amplifies a signal voltage applied to the detector circuit 10.

The RF amplifier stage 2 subjects to voltage amplification an FM radio frequency signal which has been received by the antenna 1. The first mixer circuit 3 effects the frequency mixing between an amplified FM radio frequency output signal at the output of the RF amplifier stage 2 and a first local oscillation output signal at the output of the first local oscillator circuit 4, thereby to transmit a first intermediate frequency signal of 10.7 MHz to the first IF filter 5. Preferably, the first IF filter 5 is constructed of an intermediate frequency transformer and a ceramic filter, and it has a predetermined frequency band width.

The first IF amplifier stage 6 to which the first IF signal of 10.7 MHz is applied includes three stages of cascaded differential amplifier circuits 60, 61 and 62 and a voltage regulator 63. It is formed within a single silicon semiconductor substrate by the well-known techniques for manufacturing semiconductor integrated circuits. The first semiconductor integrated circuit which includes the first IF amplifier stage 6 is indicated by broken lines $l_1$. The two differential inputs 600 and 601 of the first-stage differential amplifier circuit 60 are respectively connected to input terminals $P_{18}$ and $P_{19}$ of the first semiconductor integrated circuit, and are connected with each other through a resistor $R_1$. The 601 input of the two differential inputs is A.C. grounded A.C.-wise by a capacitor $C_1$. The two differential outputs 602 and 603 of the first-stage differential amplifier circuit 60 are respectively applied to the two differential inputs 610 and 611 of the second-stage differential amplifier circuit 61 through internal interconnections inside the first semiconductor integrated circuit. Likewise, the two differential outputs 612 and 613 of the second-stage differential amplifier circuit 61 are respectively applied to the two differential inputs 620 and 621 of the third-stage differential amplifier circuit 62 through internal interconnections inside the first semiconductor integrated circuit. Further, the two differential outputs 622 and 623 of the third-stage differential amplifier circuit 62 are respectively applied to output terminals $P_{20}$ and $P_{21}$ of the first semiconductor integrated circuit through internal interconnections inside this integrated circuit.

According to the principle of this invention, the additional first IF filter 11 is especially connected between the output terminal $P_{20}$ of the first IF amplifier stage 6 and an input terminal $P_{15}$ of the second frequency converter circuit.

As this first IF filter 11, there can be used a filter which passes the first intermediate frequency of 10.7 MHz therethrough and which rejects the higher harmonic frequency components of the first intermediate frequency, for example, a resonance circuit whose resonance frequency is the first intermediate frequency.

In order to avoid the undesirable RF signal crosstalk between the second frequency converter circuit or the detector circuit 10 and the first IF amplifier stage 6, according to the preferred embodiment of this invention, the detector circuit 10 and the second frequency converter circuit made up of the second mixer circuit 7 and the second local oscillator circuit 8 are formed within a second semiconductor integrated circuit which employs another silicon semiconductor substrate different from the silicon semiconductor substrate of the first semiconductor integrated circuit. The second semiconductor integrated circuit is indicated by broken lines $I_2$.

The second mixer circuit 7 executes the frequency mixing between an amplified first IF signal of 10.7 MHz provided at the input terminal $P_{15}$ of the second semiconductor integrated circuit through the first IF filter 11 and a second local oscillation output signal of 8.735 MHz at an output 80 of the second local oscillator circuit 8, thereby to transmit a second intermediate frequency signal of 1.965 MHz to a terminal $P_1$ of the second semiconductor integrated circuit. The oscillation frequency of the second local oscillator circuit 8 is determined by capacitors $C_5$ and $C_6$ and inductors $L_5$ and $L_6$ of a frequency selector circuit 15 which is connected between terminals $P_{16}$ and $P_{17}$. The second IF filter 9 which has a passing band width of 1 MHz–4 MHz is connected between the terminal $P_1$ and another terminal $P_4$.

A second IF signal provided at the terminal $P_4$ has a substantially sinusoidal waveform. It is amplified by the limiting amplifier 12 formed within the second semiconductor integrated circuit and having a high voltage gain, with the result that it is converted into a square pulse waveform. The second IF signal in the square pulse waveform at the output of the limiting amplifier 12 is applied to the pulse count type FM detector 10 which is also formed within the second semiconductor integrated circuit. The pulse count type FM detector 10 is constructed of a trigger circuit 100, a monostable multivibrator 110, an inverter 120, a capacitor $C_2$ which is connected between an output terminal $P_9$ of the monostable multivibrator 110 and an input terminal $P_{10}$ of the inverter 120 outside the second integrated circuit, and a resistor $R_2$ which is connected between the terminal $P_{10}$ and a terminal $P_{11}$.

The trigger circuit 100 transmits to the monostable multivibrator 110 a trigger pulse of narrow pulse width on the basis of the second IF signal in the square pulse waveform. The monostable multivibrator 110 is driven by the trigger pulse, and transmits to the inverter 120 a pulse signal having a fixed pulse width which is a decided by the time constant between the capacitor $C_2$ and the resistor $R_2$. A square pulse signal of the fixed pulse width having pulse intervals corresponding to the FM modulation is provided at an output terminal $P_8$ of the inverter 120. By connecting appropriate smoothing means to the terminal $P_8$, and FM demodulation output signal is obtained.

On the one hand, the overall voltage gain of the three stages of differential amplifier circuits 60, 61 and 62 constituting the first IF amplifier stage 6 is sufficiently high, so that the first IF signal applied to the terminal $P_{18}$, having the sinusoidal waveform of 10.7 MHz, is sufficiently amplified by the first IF amplifier stage 6. The amplified first IF signal to be provided at the output terminals $P_{20}$ and $P_{21}$ is accordingly clipped in a square pulse waveform. Thus, the first IF amplifier stage 6 operates as an amplitude-limiting amplifier. Any undesired AM signal component contained in the received FM signal can be removed owing to the amplitude-limiting operation of the first IF amplifier stage 6.

However, the amplified first IF signal of 10.7 MHz in the square pulse waveform as obtained at the terminal $P_{20}$ has the fundamental wave component of 10.7 MHz and higher harmonic components of higher frequencies.

Thus, on the other hand, the first IF filter 11 which passes the first intermediate frequency of 10.7 MHz therethrough and which stops the passage of the higher harmonic frequencies is connected between the output terminal $P_{20}$ of the first IF amplifier stage 6 and the input terminal $P_{15}$ of the second frequency converter circuit. Therefore, the higher harmonic components in the output of the first IF amplifier stage, 6 which creates the beat trouble, are removed by the first IF filter 11, and the higher harmonic components to be injected into the detector circuit 10 can be sufficiently reduced so that cross modulation is prevented.

Further, in case where the FM demodulator circuit 10 is of the pulse count type, a large detection current responsive to the second IF signal flows through this demodulator circuit. In general, an internal interconnection inside a semiconductor integrated circuit is formed of an evaporated metallic thin film and therefore has an equivalent resistance value which is not negligible. In contrast, an external interconnection to be connected outside the semiconductor integrated circuit exhibits only an equivalent resistance of a negligibly small value because a metal wire of high conductivity can be utilized.

The large detection current flows through a supply voltage-feeding internal interconnection and a grounding internal interconnection for the FM demodulator circuit 10. In consequence, voltage drops which respond to the second IF signal of 1.965 MHz and which are not negligible appear in these internal interconnections inside the semiconductor integrated circuit.

If the supply voltage-feeding internal interconnection or grounding internal interconnection of the FM demodulator circuit 10 is connected in common with a supply voltage-feeding internal interconnection or grounding internal interconnection for the second frequency converter circuit by means of an internal interconnection inside the semiconductor integrated circuit, the voltage drop which is not negligible as stated above will be transmitted to the supply voltage-feeding internal interconnection or grounding internal interconnection of the second frequency converter circuit.

Further, if the supply voltage-feeding internal interconnection or grounding internal interconnection of the FM demodulator circuit 10 is connected in common with a supply voltage-feeding internal interconnection or grounding internal interconnection for the first IF amplifier stage 6 by means of an internal interconnection inside the semiconductor integrated circuit, the voltage drop which is not negligible as stated above will be transmitted to the internal interconnection quite similarly.

The transmissions of the voltage drops which respond to the second intermediate frequency of 1.965 MHz and which are not negligible will give rise to the cross modulation between the transmitted signal of 1.965 MHz and the first IF signal of 10.7 MHz inside the first IF amplifier stage 6, and will give rise to the composite cross modulation among the transmitted signal of 1.965 MHz, the first IF signal of 10.7 MHz and the second local oscillation signal of 8.735 MHz inside the second frequency converter circuit. These cross modulations will generate higher harmonic signal components of high frequencies which similarly form the cause of beat trouble, at the output terminal $P_{20}$ of the first IF amplifier stage 6 and the output terminal $P_1$ of the second mixer circuit 7.

According to the preferred embodiment of this invention, in order to avoid the cross modulations, the transmissions of the undesired voltage drops above described are prevented. More specifically, a supply voltage-feeding internal interconnection 102 and a grounding internal interconnection 103 for the FM demodulator circuit 10 and the limiting amplifier circuit 12 are respectively connected to a supply voltage-feed terminal $P_{12}$ and a ground terminal $P_{14}$ of the second semiconductor integrated circuit. The supply voltage-feed terminal $P_{12}$ and the ground terminal $P_{14}$ are respectively connected to a common power supply terminal 15 and the ground point GND through external interconnections. A voltage regulator 14 is arranged between the supply voltage-feed terminal $P_{12}$ and the supply voltage-feeding internal interconnection 102, and delivers to a terminal 141 an operating voltage which is substantially constant against fluctuations in a voltage $V_{cc}$ supplied to the common power supply terminal 16. A ground terminal 143 of the voltage regulator 14 is also connected to the ground terminal $P_{14}$ of the second semiconductor integrated circuit through an internal interconnection.

A supply voltage-feeding internal interconnection 782 and a grounding internal interconnection 783 of the second frequency converter circuit, namely, the second mixer circuit 7 and the second local oscillator circuit 8 are respectively connected to another supply voltage feed terminal $P_3$ and another ground terminal $P_2$ of the second semiconductor integrated circuit. The ground terminal $P_2$ is connected to the ground point GND through an external interconnection. A voltage regulator 13 is arranged between the supply voltage-feeding terminal $P_3$ and the supply voltage-feeding internal interconnection 782, and delivers a substantially constant operating voltage to a terminal 131. A ground terminal 133 of this voltage regulator 13 is also connected to the ground terminal $P_2$ of the second semiconductor integrated circuit through an internal interconnection.

The first IF amplifier stage 6 is formed within the first semiconductor integrated circuit as stated above, and a supply voltage-feeding internal interconnection 64 and a grounding internal interconnection 65 thereof are respectively connected to a supply voltage-feed terminal $P_{22}$ and a ground terminal $P_{23}$ of the first semiconductor integrated circuit. The ground terminal $P_{23}$ is connected to the ground point GND through an external interconnection. A voltage regulator 63 is arranged between the supply voltage feed terminal $P_{22}$ and the supply voltage-feeding internal interconnection 64, and delivers a substantially constant operating voltage to a terminal 631 similarly to the above. A ground terminal 633 of the voltage regulator 63 is also connected to the ground terminal $P_{23}$ of the first semiconductor integrated circuit through an internal interconnection.

More preferably, a filter composed of an inductor $L_3$ and a capacitor $C_3$ and a filter composed of an inductor $L_4$ and a capacitor $C_4$ are respectively connected between the supply voltage-feed terminal $P_{12}$ and the supply voltage-feed terminal $P_3$ and between the former terminal $P_{12}$ and the supply voltage-feed terminal $P_{22}$. Thus, the transmissions of the voltages responsive to the detection current previously stated can be further reduced.

What is claimed is:

1. A double-converting FM tuner comprising:
   an antenna;
   a radio frequency amplifier circuit for amplifying an FM radio frequency signal received at said antenna;
   a first frequency converter circuit which is made up of a first mixer circuit and a first local oscillator circuit and which generates a first intermediate frequency signal from said FM radio frequency signal and a first local oscillation frequency signal generated at said first local oscillator circuit;
   a first filter means for deriving said first intermediate frequency signal from said first frequency converter circuit;
   a first intermediate frequency amplifier circuit coupled to said first filter means for amplifying said first intermediate frequency signal and limiting the amplitude of said first intermediate frequency signal to a constant magnitude, said first intermediate frequency amplifier circuit being constructed in the form of a first semiconductor integrated circuit having first and second operating-voltage-feeding external terminals for supplying an operating voltage therebetween;
   a second filter means coupled to said first intermediate frequency amplifier circuit for passing said first intermediate frequency signal therethrough and rejecting higher harmonic frequency components of said first intermediate frequency signal amplitude-limited by said first intermediate frequency amplifier circuit;
   a second frequency converter circuit which is made up of a second mixer circuit and a second local oscillator circuit and which generates a second intermediate frequency signal from said first intermediate frequency signal derived through said second filter means and a second local oscillation frequency signal generated at said second local oscillator circuit, said second frequency converter circuit being constructed in the form of a second semiconductor integrated circuit having first and second operating-voltage-feeding external terminals for supplying an operating voltage therebetween;
   a pulse count type FM demodulator circuit for obtaining an FM demodulation output signal from said second intermediate frequency signal, said pulse count type FM demodulator circuit being constructed in the form of a third semiconductor integrated circuit having first and second operating-voltage-feeding external terminals for supplying an operating voltage therebetween; and
   decoupling filter means for connecting respective ones of said first operating-voltage-feeding external terminals of the first and second semiconductor integrated circuits to said first operating-voltage-feeding external terminal of the third semiconductor integrated circuit and for preventing an undesired signal generated at said first operating-voltage-feeding external terminal of the third semiconductor integrated circuit from being transferred to said respective ones.

2. A double-converting FM tuner according to claim 1, wherein said decoupling filter means comprises a first filter means connected between said first operating-voltage-feeding external terminals of the first and third semiconductor integrated circuit, and a second filter means between said first operating-voltage-feeding external terminals of the second and third semiconductor integrated circuits.

3. A double-converting FM tuner according to claim 1, wherein said decoupling filter means is made of an inductor and a capacitor.

4. In a double-converting type FM tuner comprising:
a radio frequency amplifier circuit for amplifying an FM radio frequency signal;
a first frequency converter circuit for receiving the output signal of said radio frequency amplifier stage and generating a first FM intermediate frequency signal having a first intermediate frequency from said FM radio frequency signal and a first local oscillation signal generated therein;
a first filter means, coupled to said first frequency converter circuit and tuned to said first intermediate frequency, for deriving said first FM intermediate frequency signal from said first frequency converter circuit;
a first amplitude-limiting amplifier circuit consisting of a plurality of cascaded amplifier stages for amplifying said first FM intermediate frequency signal derived from said first filter means and limiting the amplitude of said first FM intermediate frequency signal to a constant magnitude at the final amplifier stage thereof, said first amplitude-limiting amplifier circuit being constructed in the form of a semiconductor integrated circuit;
a second filter means, coupled to the final amplifier stage of said first amplitude-limiting amplifier circuit, for receiving the amplitude-limited first FM intermediate frequency signal and rejecting higher harmonic frequency components of the amplitude-limited first FM intermediate frequency signal;
a second frequency converter circuit for receiving said first FM intermediate frequency signal derived from said second filter means and generating a second FM intermediate frequency signal having a second intermediate frequency from said first FM intermediate frequency signal and a second local oscillation signal generated therein, said second frequency converter circuit being constructed in the form of a semiconductor integrated circuit;
a third filter means, coupled to said second frequency converter circuit, for deriving said second FM intermediate frequency signal from said second frequency converter circuit; and
an FM demodulator circuit, coupled to said third filter means, for obtaining an FM demodulation output signal from said second FM intermediate frequency signal, said FM demodulator circuit is constructed in the form of a semiconductor integrated circuit,
the improvement wherein each of said semiconductor integrated circuits for said first amplitude-limiting amplifier circuit, second frequency converter circuit and FM demodulator circuit independently has a power supply external terminal for connecting an operating voltage source thereto, and wherein respective ones of said power supply external terminals for said first amplitude-limiting amplifier circuit and second frequency converter circuit are connected to said power supply external terminal for said FM demodulator circuit through decoupling filter means for decoupling said respective ones to said power supply external terminal for said FM demodulator circuit.

5. A double-converting FM tuner according to claim 4, wherein said decoupling filter means is made of an inductor and a capacitor.

6. A double-converting FM tuner according to claim 5, wherein said FM demodulator circuit is a pulse count type FM demodulator circuit.

7. A double-converting FM tuner according to claim 4, wherein each of said first amplitude-limiting amplifier circuit, second frequency converter circuit and FM demodulator circuit is supplied with an operating voltage through a voltage regulator from said power supply external terminal thereof.

8. A double-converting FM tuner according to claim 4, wherein said first amplitude-limiting amplifier circuit is constructed in the form of a first semiconductor integrated circuit having a first semiconductor substrate, while said second frequency converter circuit and said FM demodulator circuit are constructed in the form of a second semiconductor integrated circuit having a second semiconductor substrate different from said first semiconductor substrate.

* * * * *